United States Patent
Chen et al.

(10) Patent No.: US 6,777,329 B2
(45) Date of Patent: Aug. 17, 2004

(54) METHOD TO FORM C54 TISI$_2$ FOR IC DEVICE FABRICATION

(75) Inventors: Shaoyin Chen, Singapore (SG); Ze Xiang Shen, Singapore (SG); Alex See, Singapore (SG); Lap Chan, San Francisco, CA (US)

(73) Assignee: Chartered Semiconductor Manufacturing Ltd, Singapore (SG)

( * ) Notice: Subject to any disclaimer, the term of this patent is extended or adjusted under 35 U.S.C. 154(b) by 0 days.

(21) Appl. No.: 09/838,513

(22) Filed: Apr. 20, 2001

(65) Prior Publication Data

US 2002/0155703 A1 Oct. 24, 2002

(51) Int. Cl.$^7$ .............................................. H01L 21/44
(52) U.S. Cl. ...................... 438/664; 438/655; 438/656; 438/658; 438/662; 438/683
(58) Field of Search ................................ 438/655, 656, 438/658, 662, 664, 683, 649, 661, 685, 787, 795, 796, 592, 660, 684; 257/E21.199, E21.593

(56) References Cited

U.S. PATENT DOCUMENTS

| | | | | |
|---|---|---|---|---|
| 5,937,325 A | * | 8/1999 | Ishida ........................ | 438/655 |
| 5,956,137 A | | 9/1999 | Lim et al. .................... | 356/301 |
| 6,054,387 A | | 4/2000 | Fukuda ........................ | 438/683 |
| 6,071,552 A | | 6/2000 | Ku .............................. | 427/99 |
| 6,514,859 B1 | * | 2/2003 | Erhardt et al. .............. | 438/664 |

OTHER PUBLICATIONS

Mouroux, Aliette; The Reactive Formation of TiSi2 in the Presence of Refractory Metals (from V to W), Royal Institute of Technology, Department of Electronics, Stockholm 1,999.*

Mouroux, Aliette; The Reactive Formation of TiSi2 in the Presence of Refractory Metals (from V to W), Royal Institute of Technology, Department of Electronics, Stockholm 1,999; pages.*

* cited by examiner

*Primary Examiner*—George Fourson
*Assistant Examiner*—Julio J. Maldonado
(74) *Attorney, Agent, or Firm*—George O. Saile; Rosemary L. S. Pike

(57) ABSTRACT

A novel method for forming a C54 phase titanium disilicide film in the fabrication of an integrated circuit is described. A semiconductor substrate is provided having silicon regions to be silicided. A titanium layer is deposited overlying the silicon regions to be silicided. The substrate is subjected to a first annealing whereby the titanium is transformed to phase C40 titanium disilicide where it overlies the silicon regions and wherein the titanium not overlying the silicon regions is unreacted. The unreacted titanium layer is removed. The substrate is subjected to a second annealing whereby the phase C40 titanium disilicide is transformed to phase C54 titanium disilicide to complete formation of a phase 54 titanium disilicide film in the manufacture of an integrated circuit.

21 Claims, 4 Drawing Sheets

METHOD TO FORM C54 TISI$_2$ FOR IC DEVICE FABRICATION

BACKGROUND OF THE INVENTION (1) Field of the Invention

The invention relates to the fabrication of integrated circuit devices, and more particularly, to a method of using laser annealing to form a high quality titanium silicide in the fabrication of integrated circuits.

(2) Description of the Prior Art

Due to the "fine line effect," C54 titanium disilicide is difficult to achieve in sub 0.18 μm polysilicon lines. Typically, a C49 phase titanium disilicide (TiSi$_2$) is formed after a first annealing. This material has a high resistivity however, so a second annealing is performed to change the phase of the TiSi$_2$ to C54, which has much lower resistivity. An additional silicon implantation step has been used for salicidation, to change the top portion of the silicon substrate to an amorphous layer, but this causes transient enhanced dopant diffusion, dopant redistribution, silicon defects, and, hence, device degradation. It is desired to find a method to form a high quality C54 TiSi$_2$ that can be achieved for deep submicron feature sizes.

A number of patents teach formation of C54 titanium silicide. U.S. Pat. No. 5,937,325 to Ishida teaches using laser annealing to form C49 TiSi$_2$, then a rapid thermal annealing (RTA) to form C54 TiSi$_2$ on a polysilicon gate. Then, a first and second RTA form C49, then C54 TiSi$_2$ on the source/drain regions. U.S. Pat. No. 6,054,387 to Fukuda teaches forming C49 TiSi$_2$ by RTA, then warping the device while performing a second RTA to form C54 TiSi$_2$. U.S. Pat. No. 6,071,552 to Ku discloses deposition of C49 TiSi$_2$, then an RTA to form C54 TiSi$_2$. U.S. Pat. No. 5,956,137 to Lim et al discloses a method to use Raman analysis to determine the phase of a silicide.

SUMMARY OF THE INVENTION

A principal object of the present invention is to provide an effective and very manufacturable method of fabricating a titanium disilicide film in the fabrication of an integrated circuit.

A further object of the invention is to provide a method of fabricating C54 phase titanium disilicide in the fabrication of an integrated circuit.

Yet another object is to provide a method of forming a C54 phase titanium disilicide film for deep submicron devices.

Yet another object is to provide a method of forming a C54 phase titanium disilicide film for deep submicron devices wherein the C54 phase is formed based on a C40 titanium disilicide.

Yet another object of the invention is to forming a C54 phase titanium disilicide film using laser annealing to first form C40 phase titanium disilicide, and then using a lower temperature annealing to form C54 phase titanium disilicide.

In accordance with the objects of the invention a novel method for forming a C54 phase titanium disilicide film in the fabrication of an integrated circuit is achieved. A semiconductor substrate is provided having silicon regions to be silicided. A titanium layer is deposited overlying the silicon regions to be silicided. The substrate is subjected to a first annealing whereby the titanium is transformed to phase C40 titanium disilicide where it overlies the silicon regions and wherein the titanium not overlying the silicon regions is unreacted. The unreacted titanium layer is removed. The substrate is subjected to a relatively low temperature second annealing whereby the phase C40 titanium disilicide is transformed to phase C54 titanium disilicide to complete formation of a phase C54 titanium disilicide film in the manufacture of an integrated circuit.

BRIEF DESCRIPTION OF THE DRAWINGS

In the accompanying drawings forming a material part of this description, there is shown.

DESCRIPTION OF THE PREFERRED EMBODIMENTS

The process of the present invention can be used in any application in which it is desired to form a titanium disilicide film overlying a silicon region. The process of the invention will be described for the application in which TiSi$_2$ is formed overlying a gate electrode and source and drain regions. It is to be understood that the invention is not limited to the application so illustrated.

Figure 1:
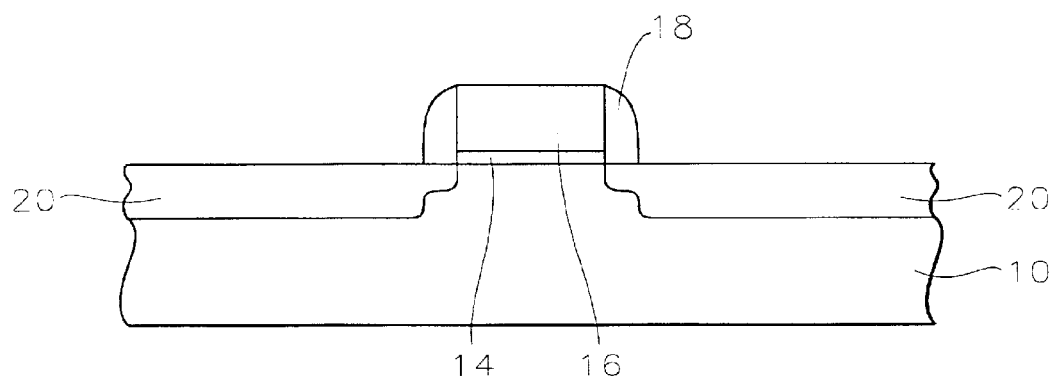
FIGS. 1 through 5 schematically illustrate in cross-sectional representation a preferred embodiment of the present invention.

Referring now more particularly to FIG. 1, there is shown an illustration of a portion of a partially completed integrated circuit. The semiconductor substrate 10 is preferably composed of silicon having a (100) crystallographic orientation. Gate electrodes 16 and source and drain regions 20 are formed in and on the semiconductor substrate as is conventional in the art. For example, gate electrode 16 has been formed overlying a gate oxide layer 14. Sidewall spacers, such as silicon oxide, 18 are formed on the gate. Source and drain regions are n-type or p-type, depending on the type of device to be fabricated.

Figure 2:
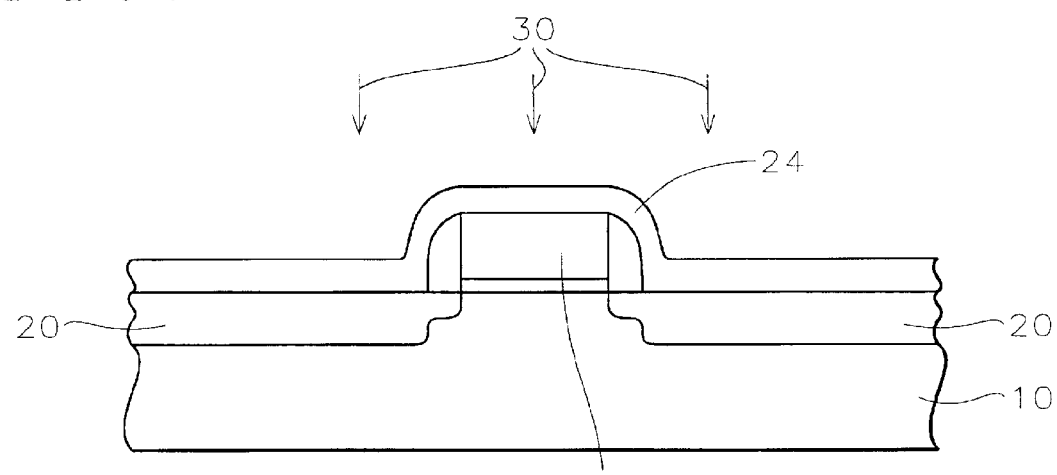

The wafer is subjected to a pre-metal clean, such as a wet clean using hydrofluoric acid (HF), for example. Next, as shown in FIG. 2, a layer of titanium or titanium nitride 24 is sputter deposited over the surface of the substrate and overlying the gate electrode. The titanium or titanium nitride layer 24 has a thickness of between about 100 and 500 Angstroms.

Figure 3:
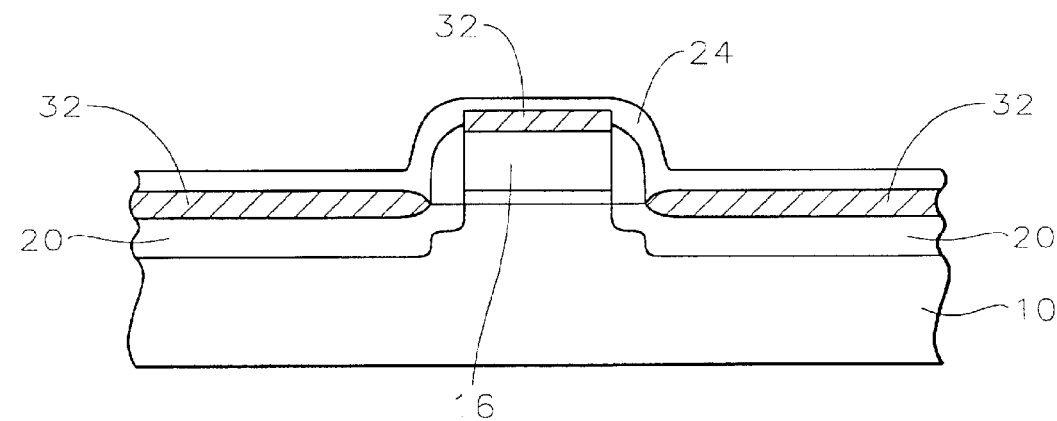

Now, the wafer is subjected to a laser annealing process 30. A Nd:YAG laser may be used, having a wavelength of 1.06 nm and energy of between about 0.5 and 1.5 Joules/cm$^2$. Preferably, a KrP Excimer laser is used, having a wavelenghth of 248 nm and energy of between about 0.1 and 1.2 Joules/cm$^2$. A prior art approach uses very high laser energy to melt the silicon. In the process of the present invention, a solid state reaction process is used. The laser energy must be adjusted carefully so as not to cause melting of the silicon. It is possible that C40 titanium disilicide could be formed by another process, such as RTA. However, the laser annealing process of the present invention has been proved experimentally. This annealing will form phase C40 titanium disilicide ($TiSi_2$) 32 over the gate electrode and over the source and drain regions, as shown in FIG. 3. C40 titanium disilicide has a crystal lattice structure very similar to that of C54, but quite different from that of C49. The extreme non-equilibrium of the laser annealing process of the invention favors the formation of meta-stable phase C40 $TiSi_2$.

Figure 4:
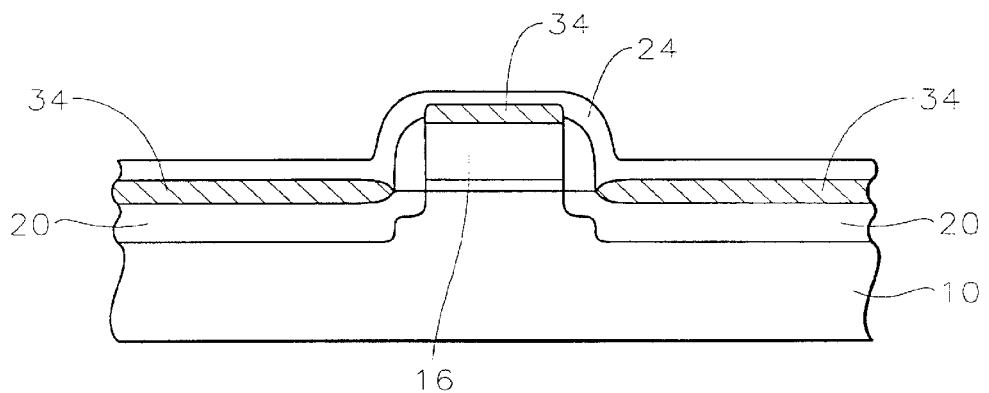

Referring now to FIG. 4, the wafer is subjected to a low temperature rapid thermal anneal (RTA) or furnace anneal at a temperature of between about 550 and 860° C. and preferably less than about 700° C., or about 650° C., to transform the phase C40 $TiSi_2$ to phase C54 $TiSi_2$ 34. Some of the previously unreacted titanium layer 24 reacts with the silicon to form additional C54 phase $TiSi_2$.

Figure 5:
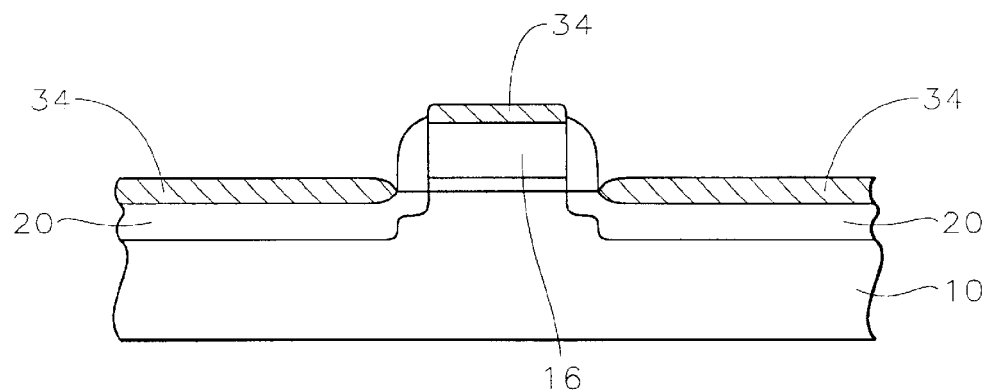

As shown in FIG. 5, the unreacted titanium or titanium nitride layer 24 is stripped from the wafer surface, leaving the C54 $TiSi_2$ film 34 over the gate electrode 16 and the source and drain regions 20. Alternatively, the low temperature annealing step can be performed after the unreacted titanium 24 is stripped.

The process of the present invention eliminates the "fine line effect" which originates from the C49 grain growth. Since C49 to C54 transformation is nucleation-controlled, it is difficult to achieve in narrow polysilicon lines. The inventive process does not involve C49 grain growth, so the C54 formation is diffusion-limited thus eliminating the "fine line effect."

A conventional second RTA temperature is about 800 to 860° C. In the process of the invention, a lower temperature RTA, of preferably less than 700° C. is used. Because the crystallographic orientation of C40 is quite similar to C54, low temperature annealing is sufficient for the phase transformation. Homogeneous C54 phase can be formed from C40 $TiSi_2$. The low temperature annealing helps to minimize undesired dopant diffusion, redistribution, and gate to source/drain leakage.

Figure 6:
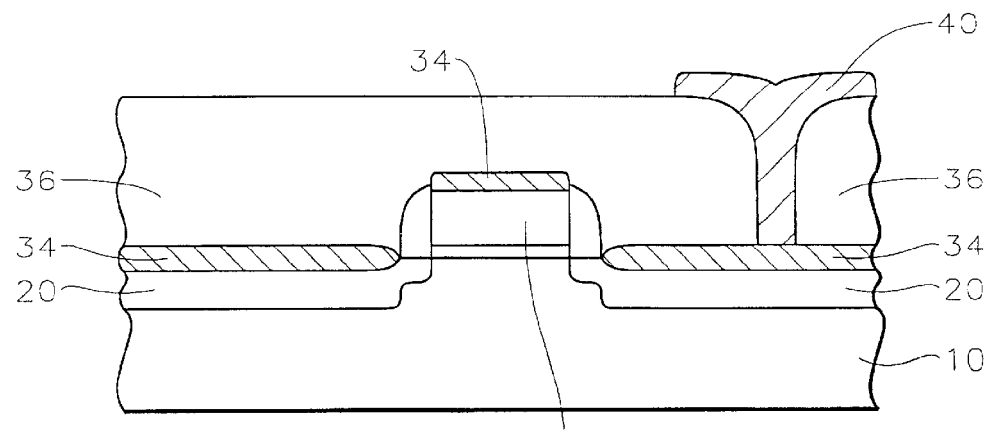
FIG. 6 schematically illustrates in cross-sectional representation a completed integrated circuit manufactured according to the process of the present invention.

Standard backend processing continues as is conventional to complete the integrated circuit. For example, FIG. 6 shows the silicided gate and source/drain regions covered by a thick dielectric layer 36. Electrical connections may be made, for example, to one of the silicided source/drain regions 20 by metal contact 40, as shown.

EXAMPLE

The following Example is given to show the important features of the invention and to aid in the understanding thereof. Variations may be made by those skilled in the art without departing from the spirit and scope of the invention.

The process of the present invention has been implemented. After laser annealing the titanium layer, an electron diffraction pattern showed that the resulting titanium silicide layer was phase C40. A transmission electron microscopy (TEM) cross-sectional image of the laser-annealed sample showed a smooth interface between the silicon and the C40 $TiSi_2$.

Experiments were performed to determine the best time and temperature for the phase-changing annealing to form C54 $TiSi_2$. U.S. Pat. No. 5,956,137 to Lim et al, assigned to the same assignees as is this patent application, discusses the application of micro-Raman spectroscopy to determining the phase of a material. Raman spectroscopy was used to measure these experiments.

Figure 7:
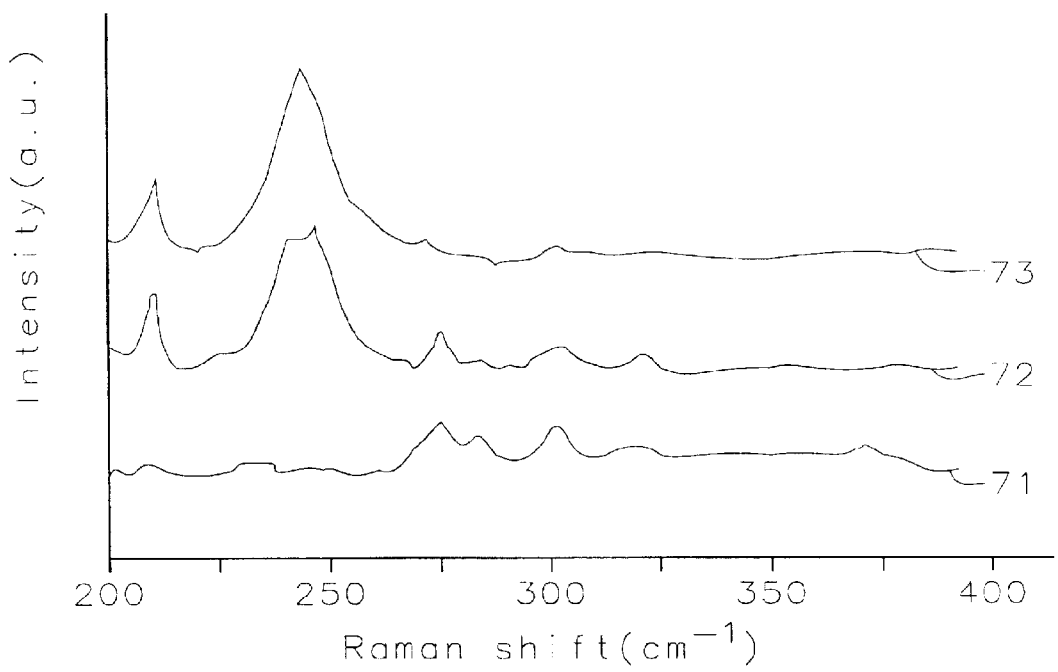
FIG. 7 graphically illustrates the Raman spectra of a titanium C40 sample after annealing at 600° C. for different times.

FIG. 7 illustrates the Raman spectra of titanium C40 sample after annealing at 600° C. for different times. The graph shows normalized intensity in arbitrary units (a.u.) vs. the Raman shift per centimeter. Line 71 illustrates 0 minutes of annealing, line 72 illustrates 5 minutes, and line 73 illustrates 10 minutes of annealing. The graph indicates that C54 can grow quickly on top of C40 at low temperatures. After annealing at 600° C. for only 5 minutes (line 72), strong C54 signals are present. After 10 minutes (line 73), the C54 grows even thicker.

Figure 8:
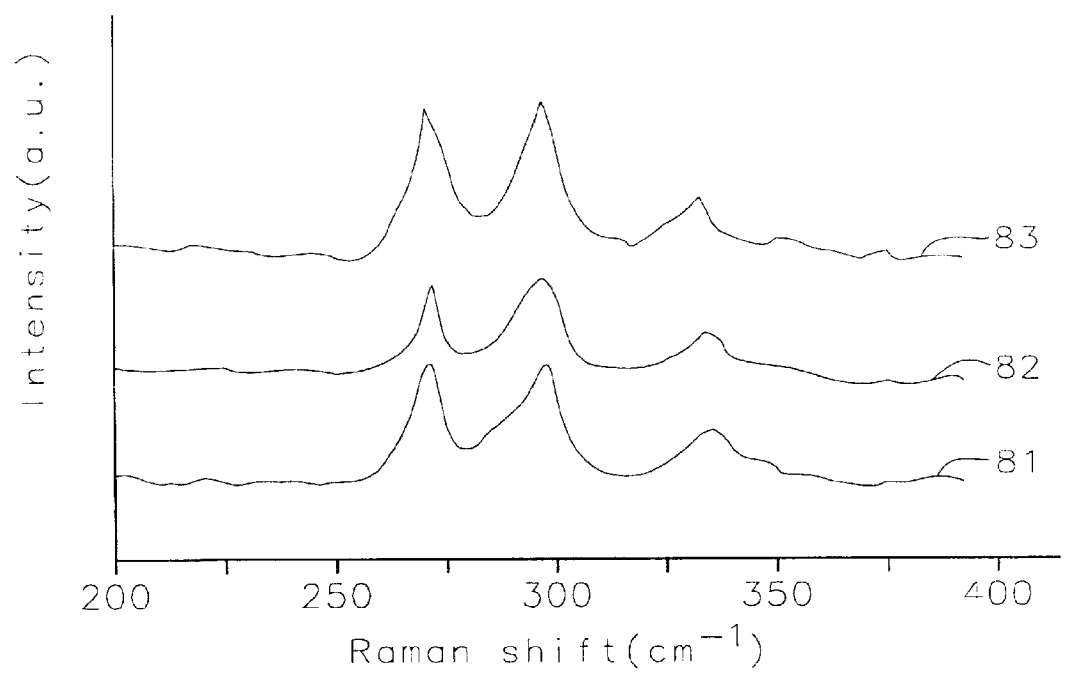
FIG. 8 graphically illustrates the Raman spectra of a titanium C49 sample after annealing at 600° C. for different times.

FIG. 8 illustrates the Raman spectra of a titanium C49 sample after annealing at 600° C. for different times. The graph shows normalized intensity in arbitrary units (a.u.) vs. the Raman shift per centimeter. Line 81 illustrates 0 minutes of annealing, line 82 illustrates 5 minutes, and line 83 illustrates 10 minutes of annealing. This graph shows that even after 10 minutes of annealing at 600° C., the C49 titanium silicide is not changed to C54. This indicates that C54 can grow on top of C40 at temperatures far below the C49 to C54 phase transformation. Only the C40 phase titanium silicide of the present invention can be changed to phase C54 by a low temperature annealing.

Figure 9:
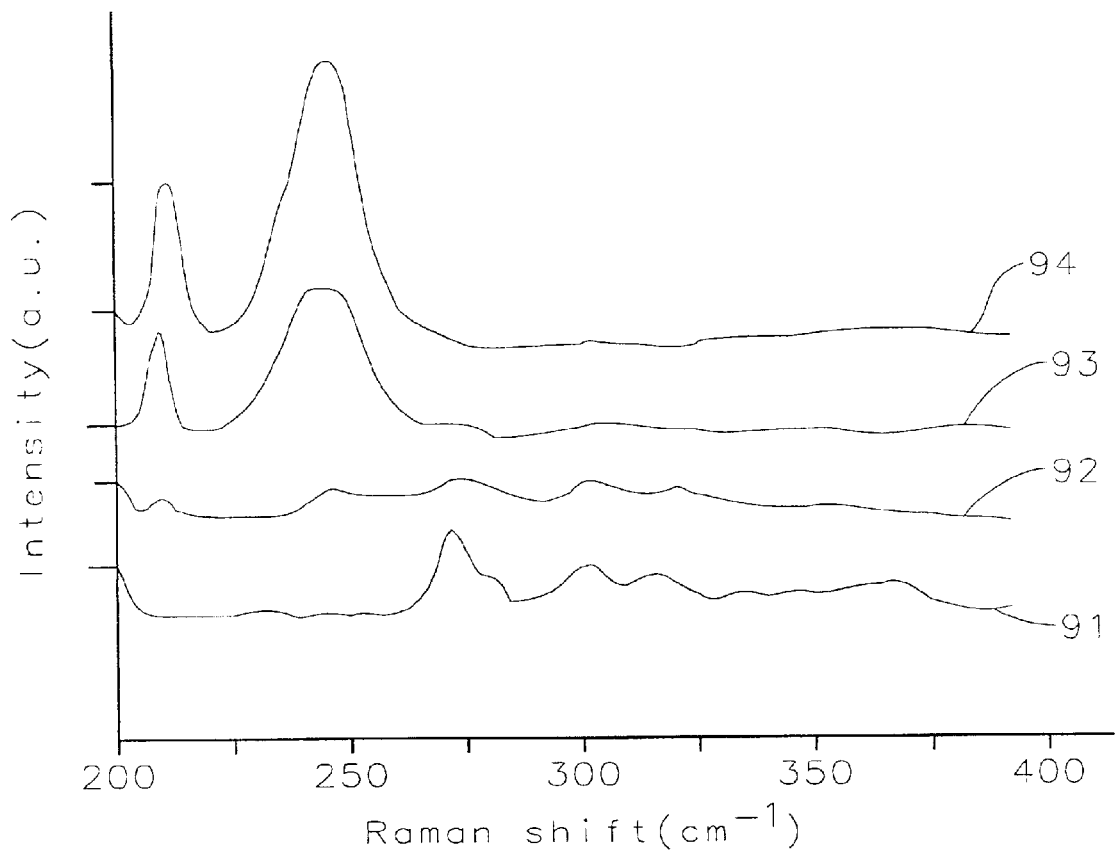
FIG. 9 graphically illustrates the Raman spectra of a titanium C40 sample after annealing for 60 seconds at different temperatures.

FIG. 9 illustrates the Raman spectra of the titanium C40 sample after annealing at different temperatures for 60 seconds. The graph shows normalized intensity in arbitrary units (a.u.) vs. the Raman shift per centimeter. Line 91 illustrates the sample before treatment, line 92 illustrates an annealing at 630° C., line 93 illustrates an annealing at 660° C., and line 94 illustrates an annealing at 700° C. This graph shows that the C54 phase titanium silicide can grow on top of phase C40 at temperatures greater than 630° C.

The process of the invention provides an effective method of forming $TiSi_2$, especially for deep submicron feature sizes. First, phase C40 $TiSi_2$ is formed by laser annealing. Then, a second annealing step at low temperature converts phase C40 to phase C54 $TiSi_2$. For furnace annealing, the preferred temperature is less than 650° C. for less than 30 minutes. For RTA, the preferred temperature is less than 700° C. for less than 60 seconds.

While the invention has been particularly shown and described with reference to the preferred embodiments thereof, it will be understood by those skilled in the art that various changes in form and details may be made without departing from the spirit and scope of the invention.

What is claimed is:

1. A method of fabricating a titanium disilicide film in the manufacture of an integrated circuit comprising:

providing a semiconductor substrate having silicon regions to be silicided;

depositing a titanium layer directly overlying said silicon regions to be silicided;

subjecting said substrate to a laser annealing wherein said laser annealing transforms said titanium to phase C40 titanium disilicide where it overlies said silicon regions and wherein said titanium not overlying said silicon regions is unreacted;

subjecting said substrate to a second annealing whereby phase C54 titanium disilicide is grown overlying said phase C40 titanium disilicide and whereby said phase C40 titanium disilicide is transformed to phase C54 titanium disilicide; and removing said unreacted titanium layer to complete formation of said titanium disilicide film in the manufacture of said integrated circuit.

2. The method according to claim 1 wherein said silicon regions to be silicided comprise gate electrodes and associated source and drain regions.

3. The method according to claim 1 wherein said titanium layer is sputter deposited to a thickness of between about 100 and 500 Angstroms.

4. The method according to claim 1 wherein said laser annealing uses a laser having a wavelength of 1.06 nm and energy between about 0.5 and 1.5 Joules/cm$^2$.

5. The method according to claim 1 wherein said laser annealing uses an Excimer laser having a wavelength of 248 nm and energy between about 0.1 and 1.2 Joules/cm$^2$.

6. The method according to claim 1 wherein said second annealing is a rapid thermal annealing performed at a temperature of between about 550 and 860° C. for 0.5 to 2 minutes.

7. The method according to claim 1 wherein said second annealing is a furnace annealing performed at a temperature of between about 500 and 750° C. for 5 to 60 minutes.

8. A method of fabricating a titanium disilicide film in the manufacture of an integrated circuit comprising:

providing a semiconductor substrate having silicon regions to be silicided;

depositing a titanium layer directly overlying said silicon regions to be silicided;

subjecting said substrate to a laser annealing wherein said laser annealing transforms said titanium to phase C40 titanium disilicide where it overlies said silicon regions and wherein said titanium not overlying said silicon regions is unreacted;

subjecting said substrate to a low temperature annealing whereby said phase C40 titanium disilicide is grown overlying said phase C40 titanium disilicide and whereby said phase C40 titanium disilicide is transformed to phase C54 titanium disilicide; and removing said unreacted titanium layer to complete formation of said titanium disilicide film in the manufacture of said integrated circuit.

9. The method according to claim 8 wherein said silicon regions to be silicided comprise gate electrodes and associated source and drain regions.

10. The method according to claim 8 wherein said titanium layer is sputter deposited to a thickness of between about 100 and 500 Angstroms.

11. The method according to claim 8 wherein said laser annealing uses a laser having a wavelength of 1.06 nm and energy between about 0.5 and 1.5 Joules/cm$^2$.

12. The method according to claim 8 wherein said laser annealing uses an Excimer laser having a wavelength of 248 nm and energy between about 0.1 and 1.2 Joules/cm$^2$.

13. The method according to claim 8 wherein said low temperature annealing is a rapid thermal annealing performed at a temperature of between about 550 and 860° C. for 0.5 to 2 minutes.

14. The method according to claim 8 wherein said low temperature annealing is a furnace annealing performed at a temperature of between about 500 and 750° C. for 5 to 60 minutes.

15. A method of fabricating a titanium disilicide film in the manufacture of an integrated circuit comprising:

providing a semiconductor substrate having silicon regions to be silicided;

depositing a titanium layer directly overlying said silicon regions to be silicided;

subjecting said substrate to a laser annealing wherein said laser annealing transforms said titanium to phase C40 titanium disilicide where it overlies said silicon regions and wherein said titanium not overlying said silicon regions is unreacted;

subjecting said substrate to a second annealing at a temperature of less than 700° C. whereby said phase C40 titanium disilicide is transformed to phase C54 titanium disilicide; and removing said unreacted titanium disilicide to complete formation of said titanium disilicide film in the manufacture of said integrated circuit.

16. The method according to claim 15 wherein said silicon regions to be silicided comprise gate electrodes and associated source and drain regions.

17. The method according to claim 15 wherein said titanium layer is sputter deposited to a thickness of between about 100 and 500 Angstroms.

18. The method according to claim 15 wherein said laser annealing usea a laser having a wavelength of 1.06 nm and energy between about 0.5 and 1.5 Joules/cm$^2$.

19. The method according to claim 15 wherein said laser annealing uses an Excimer laser having a wavelength of 248 nm and energy between about 0.1 and 1.2 Joules/cm$^2$.

20. The method according to claim 15 wherein said second annealing is a rapid thermal annealing performed at a temperature of between about 550 and 860° C. for 0.5 to 2 minutes.

21. The method according to claim 15 wherein said second annealing is a furnace annealing performed at a temperature of between about 500 and 750° C. for 5 to 60 minutes.

* * * * *